US006961264B2

(12) United States Patent
Tsuchida

(10) Patent No.: US 6,961,264 B2
(45) Date of Patent: Nov. 1, 2005

(54) SEMICONDUCTOR INTEGRATED CIRCUIT DEVICE

(75) Inventor: Kenji Tsuchida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 77 days.

(21) Appl. No.: 10/776,249

(22) Filed: Feb. 12, 2004

(65) Prior Publication Data

US 2005/0117390 A1 Jun. 2, 2005

(30) Foreign Application Priority Data

Nov. 28, 2003 (JP) .............................. 2003-399775

(51) Int. Cl.[7] .............................................. G11C 16/04
(52) U.S. Cl. ................ 365/158; 365/189.06; 365/225.5
(58) Field of Search ................................ 365/171, 158, 365/173, 189.06, 189.03, 189.08, 207, 225.5

(56) References Cited

U.S. PATENT DOCUMENTS

| | | | |
|---|---|---|---|
| 6,205,073 B1 * | 3/2001 | Naji ........................... | 365/209 |
| 6,563,743 B2 | 5/2003 | Hanzawa et al. | |
| 6,603,677 B2 * | 8/2003 | Redon et al. ................ | 365/158 |
| 2004/0004856 A1 * | 1/2004 | Sakimura et al. ............ | 365/158 |
| 2005/0047202 A1 * | 3/2005 | Shimizu et al. ............. | 365/158 |
| 2005/0047205 A1 * | 3/2005 | Tsuchida ..................... | 365/171 |

* cited by examiner

*Primary Examiner*—Anh Phung
*Assistant Examiner*—Hien Nguyen
(74) *Attorney, Agent, or Firm*—Oblon, Spivak, McClelland, Maier & Neustadt, P.C.

(57) ABSTRACT

A semiconductor integrated circuit device has a semiconductor substrate comprising a first region extending along the edge and a second region surrounded by the first region. Memory cell arrays are provided in the second region, and comprising a plurality of cells having an MTJ element. Gate transistors are provided in the first region, and have a current path having a first terminal connected with a bit line, which is a signal read path from the cells, and a second terminal opposite to the first terminal. Data buses are connected with the same number of the second terminals. A connection control circuit is provided in the second region, and connects selected two of the data buses to first and second output terminals, respectively. An amplifier circuit is provided in the first region, and amplifies a potential difference in accordance with signals outputted from the first and second output terminals.

20 Claims, 15 Drawing Sheets

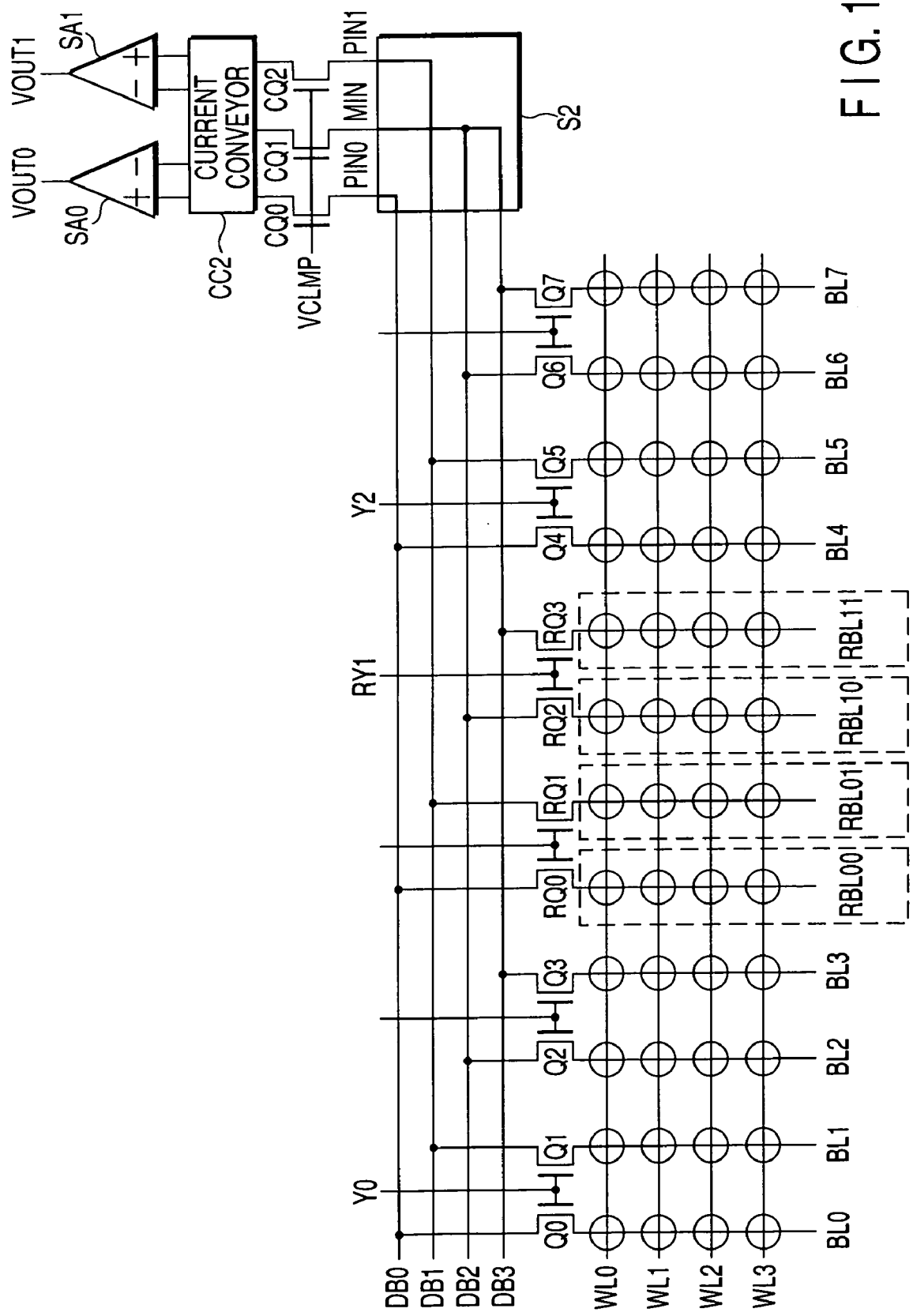
F I G. 12

US 6,961,264 B2

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2003-399775, filed Nov. 28, 2003, the entire contents of which are incorporated herein by reference.

BACKGROUND OF THE INVENTION

1. Field of the Invention

The present invention relates to a semiconductor integrated circuit device, for example, a read circuit system of a magnetic random access memory.

2. Description of the Related Art

As shown in FIG. 18, the magnetic random access memory cell is composed of a MTJ (Magnetic Tunnel Junction) element MTJ, and a select transistor Tr. The select transistor Tr has one terminal connected with the MTJ element and the other terminal connected with a ground potential line. The MTJ element has a stacked structure comprising two ferromagnetic layers and an insulating layer interposed between them, and records information using magnetic resistance changes by the spin polarization tunnel effect. Write to the MTJ element MTJ is carried out in the following manner. Bit line BL and write word line WWL, which are mutually orthogonal using the MTJ element MTJ as the intersecting point, change the relative spin direction of two ferromagnetic layers by the combined magnetic field. The gate of the select transistor Tr is connected with a read word line RWL for selecting the cell.

FIG. 19 is a view showing the configuration of principal parts of a conventional MRAM. The intersecting points of bit lines BL0 to BL3, RBL0, RBL1 and word lines WL0 to WL3 are each provided with a cell. In these cells, cells surrounded by a broken line are reference cells, and others are memory cells. A current conveyor CC converts the read potential read from memory cells MC and the reference potential read from reference cells RMC for generating reference potential into voltage. Thereafter, a sense amplifier SA compares and amplifies two voltages.

A reference potential read bus RDB is connected with two read gate transistors RQ. This is based on the following reason. Information (data) "0" and "1" stored in the reference cells RMC connected with read gate transistors are combined, thereby generating a binary intermediate reference potential. On the other hand, a read data bus DB is connected with some read gate transistors in accordance with the memory capacity. The number (total gate width) differs from the read gate transistor RQ. Thus, the total amount of PN junction leak current and channel leak current of these transistors Q and RQ, that is, CR time constant is different between read data buses DB and RDB. Accordingly, the voltage conversion speed of the current conveyor CC is different between read data buses DB and RDB. In particular, sense amplification is not normally carried out in the initial stage of the sense amplification, and thereby, there is a possibility that erroneous output Vout is outputted. As a result, read margin reduces.

BRIEF SUMMARY OF THE INVENTION

According to a first aspect of the invention, there is provided a semiconductor integrated circuit device comprising: a semiconductor substrate comprising a first region extending along an edge and a second region surrounded by the first region; a plurality of memory cell arrays provided in the second region, and comprising a plurality of cells having an MTJ element; a plurality of gate transistors provided in the first region, and having a current path having a first terminal connected with a bit line, which is a signal read path from the cells, and a second terminal opposite to the first terminal; a plurality of data buses connected with a same number of the second terminals; a connection control circuit provided in the first region, and connected with an end of the data buses, and connecting selected two of the data buses to first and second output terminals, respectively; and an amplifier circuit provided in the first region, and amplifying a potential difference in accordance with signals outputted from the first and second output terminals.

According to a second aspect of the invention, there is provided a semiconductor integrated circuit device comprising: a semiconductor substrate; a plurality of memory cell arrays provided in a center of the semiconductor substrate, and comprising a plurality of cells having an MTJ element; and a plurality of peripheral functional sections provided only around the memory cell arrays on the semiconductor substrate, at least one of the peripheral functional sections including: a plurality of gate transistors having a current path having a first terminal connected with one bit line, which is a signal read path from the cells, and a second terminal opposite to the first terminal; a plurality of data buses connected with a same number of the second terminals; a connection control circuit connected with an end of the data buses, and connecting selected two of the data buses to first and second output terminals, respectively; and an amplifier circuit amplifying a potential difference in accordance with signals outputted from the first and second output terminals.

BRIEF DESCRIPTION OF THE SEVERAL VIEWS OF THE DRAWING

FIG. 12 is a view showing one state of the circuit shown in FIG. 11

DETAILED DESCRIPTION OF THE INVENTION

Figure 1:
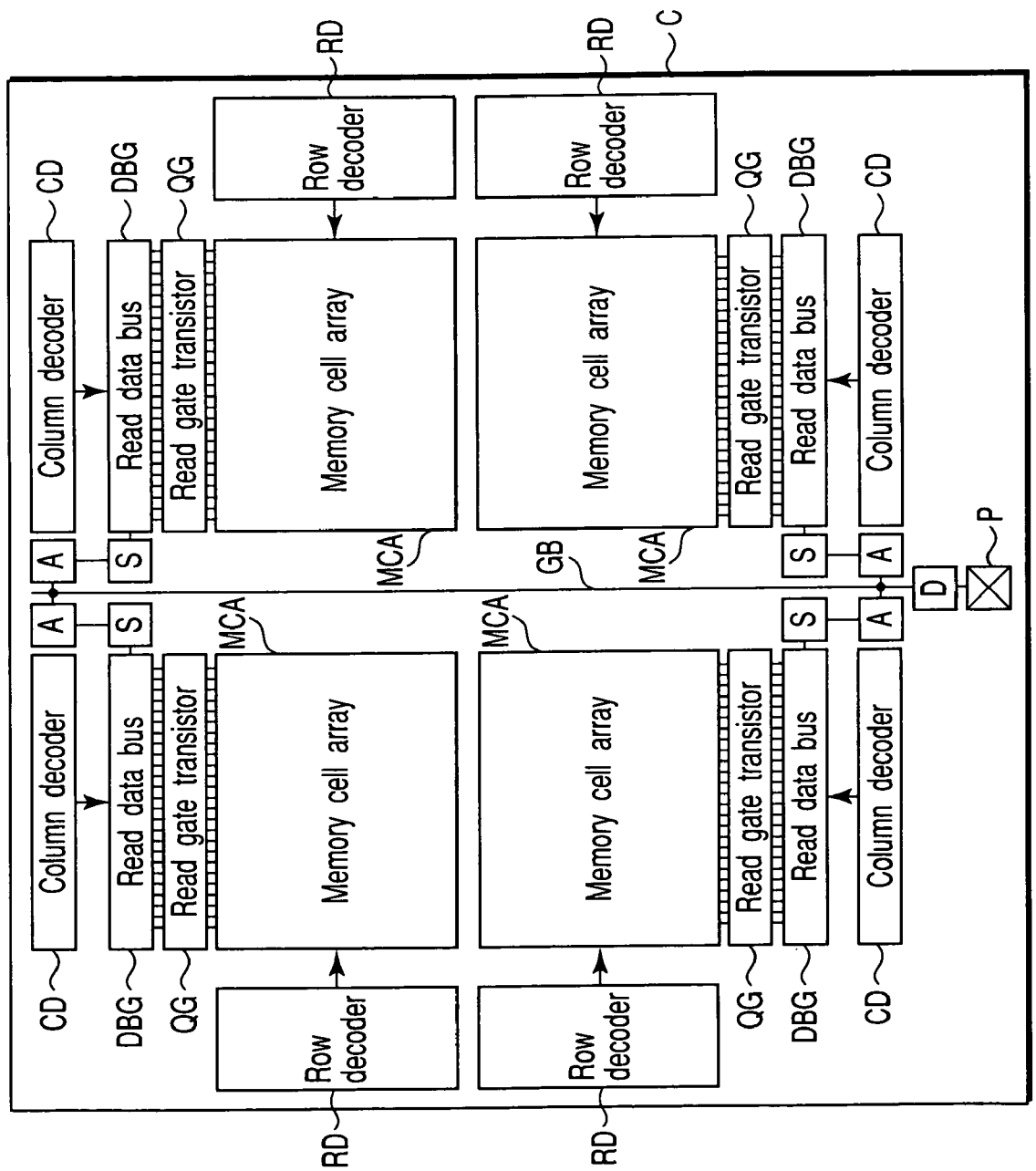
FIG. 1 is a view showing the layout of a semiconductor integrated circuit device according to a first embodiment of the present invention.

Embodiments of the present invention will be described below with reference to the accompanying drawings. In the following description, the same reference numerals are used to designate components having the identical function and configuration, and an overlapping explanation is made if necessary.

First Embodiment

Figure 18:
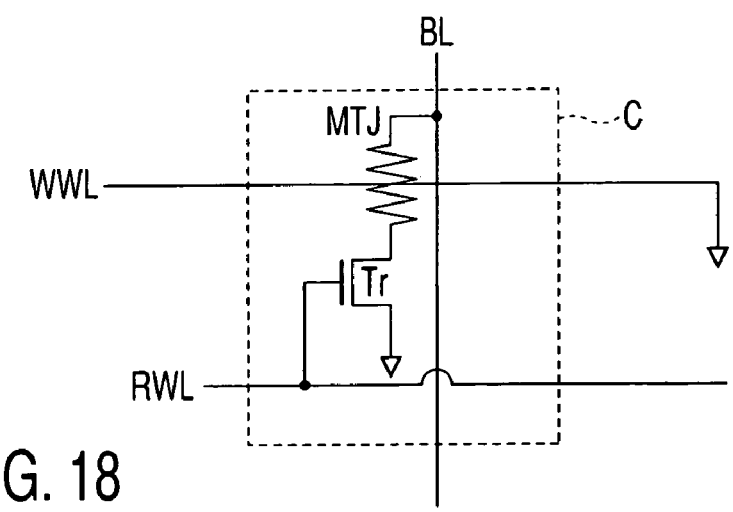
FIG. 18 is a view showing a MRAM cell.
Figure 19:
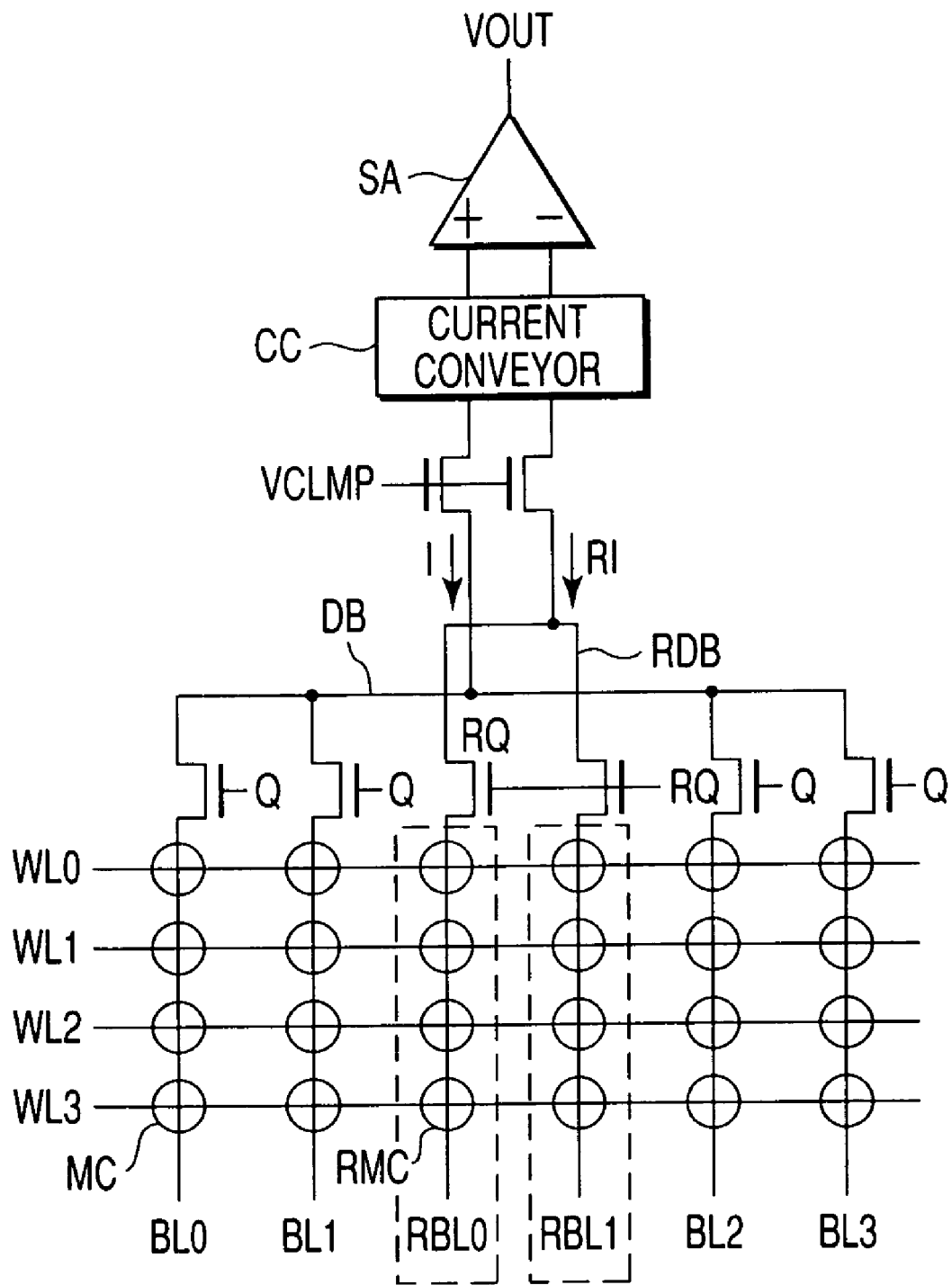
FIG. 19 is a view showing the configuration of principal parts of a conventional MRAM.

FIG. 1 is a view showing the layout of a semiconductor integrated circuit device according to a first embodiment of the present invention. As shown in FIG. 1, memory cell arrays MCA are provided in the vicinity of the center on a semiconductor chip C. Each memory cell array MCA is provided with a plurality of cells comprising the MTJ element MTJ and the select transistor Tr shown in FIG. 18, and with interconnects such as bit line and word line. In other words, the memory cell array MCA is not provided with other switches.

Row decoders RD, read gate transistor group QG, read data bus group DBG and column decoders CD are arranged around the region where the memory cell arrays MCA are provided, and independent from these memory cell arrays MCA. The foregoing row decoder RD, read gate transistor group QG, read data bus group DBG and column decoder CD are provided with respect to each memory cell array MCA.

The row decoder RD is provided at the position adjacent to the memory cell array MCA, and drives a word line (not shown) in accordance with an address signal. Read gate transistor group QG, read data bus group DBG and column decoder CD are provided in line on the side different from the side of each memory cell array MCA facing the row decoder RD. The read gate transistor group QG is connected between cells (not shown) included in the memory cell array MCA and the read data bus group DBG. The column decoder CD turns on and off read gate transistors (not shown) included in the read gate transistor group QG in accordance with an address signal. As a result, predetermined cell and read data bus are selectively connected.

The end of the read data bus group DBG is connected with a read data bus selector (connection control circuit) S. The read data bus selector S has two output terminals, and selectively connects two of several read data buses to these output terminals. The read data bus selector S is connected with a read amplifier section (amplifier circuit) A via the output terminals. The read amplifier section A converts current outputted from the read data bus selector S into voltage, and amplifies two potential differences. The read amplifier section A is connected with an output pad P via common read data bus GB and driver D.

Figure 2:
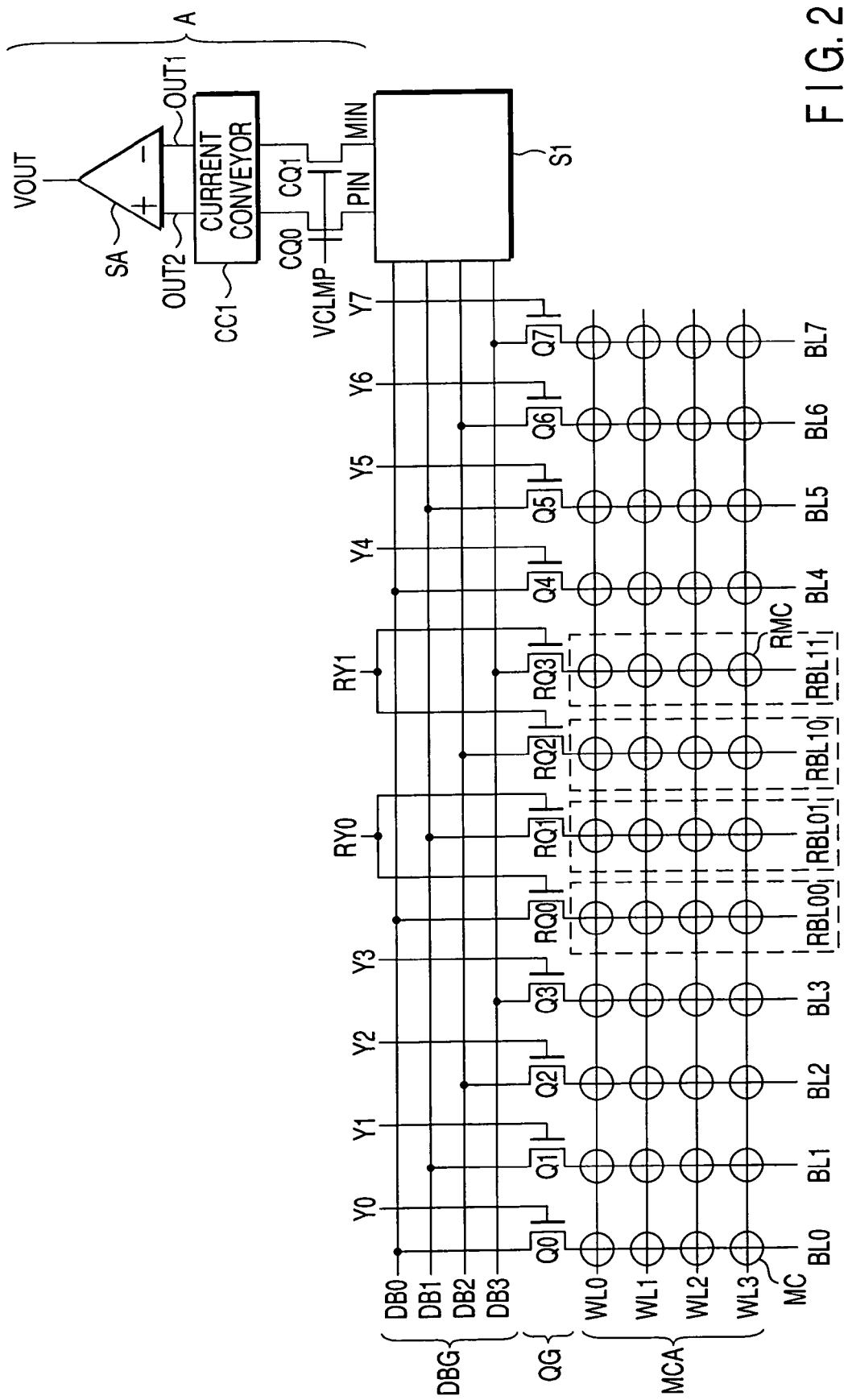
FIG. 2 is a view showing part of the circuit shown in FIG. 1 in detail.

FIG. 2 is a view showing detail of a part of the circuit shown in FIG. 1. More specifically, FIG. 2 shows the internal configuration of memory cell array MCA, read gate transistor group QG, read data bus group DBG, read data bus selector S1 and read amplifier section A. As illustrated in FIG. 2, the memory cell array MCA is provided with cells arrayed like a matrix. The cell includes a memory cell storing data, and reference cell for generating reference potential (reference data). The cell is provided at each intersecting point of word lines WL0 to WL3 and bit lines BL0 to BL7, RBL00, RBL01, RBL10 and RBL11. Cells connected with bit lines (reference bit lines) RBL00, RBL01, RBL10 and RBL11, that is, surrounded by a broken line are reference cell RMC. Other cells are memory cells MC. The bit lines BL0 to BL7 have a signal read path function from the memory cell MC. The reference bit lines RBL00, RBL01, RBL10 and RBL11 have a signal read path function from the reference cell RMC. Reference cells connected to bit lines RBL00 and RBL01 hold data complementary to each other. Likewise, reference cells connected to bit lines RBL10 and RBL11 hold data complementary to each other.

The word lines WL0 to WL3 are connected with the row decoder RD of FIG. 1. The end of bit lines BL0 to BL7 is respectively connected with one terminal of read gate transistors Q0 to Q7 comprising MOS (Metal Oxide Semiconductor) transistor. Read gate transistors Q0 to Q7 and RQ0 to RQ3 constitute the read gate transistor group QG of FIG. 1.

The gate of the read gate transistors Q0 to Q7 is supplied with column select signals Y0 to Y7, respectively. Read gate transistors RQ0 and RQ1 are supplied with a column select signal RY0. Read gate transistors RQ2 and RQ3 are supplied with a column select signal RY1. The column select signals Y0 to Y7, RY0 and RY1 are supplied from the column decoder.

The other terminals of the read gate transistors Q0, RQ0 and Q4 are connected with the read data bus DB0. The other terminals of the read gate transistors Q1, RQ1 and Q5 are connected with the read data bus DB1. The other terminals of the read gate transistors Q2, RQ2 and Q6 are connected with the read data bus DB2. The other terminals of the read gate transistors Q3, RQ3 and Q7 are connected with the read data bus DB3. The number of bit lines RBL00, RBL01, RBL10 and RBL11 connected with the reference cell is the same as the number of read data buses DB0 to DB3. The total number of read gate transistors Q0 to Q7 and RQ0 to RQ3 connected to each of read data buses DB0 to DB3 is equal.

The ends of read data buses DB0 to DB3 are connected with the read data bus selector S1. Output terminals PIN and MIN of the read data bus selector S1 are connected (supplied) to a current conveyor CC1 via clamping transistors CQ0 and CQ1, respectively. Output terminals OUT1 and OUT2 of the current conveyor are connected to inverted and non-inverting input terminal of a sense amplifier SA, respectively.

Figure 3:
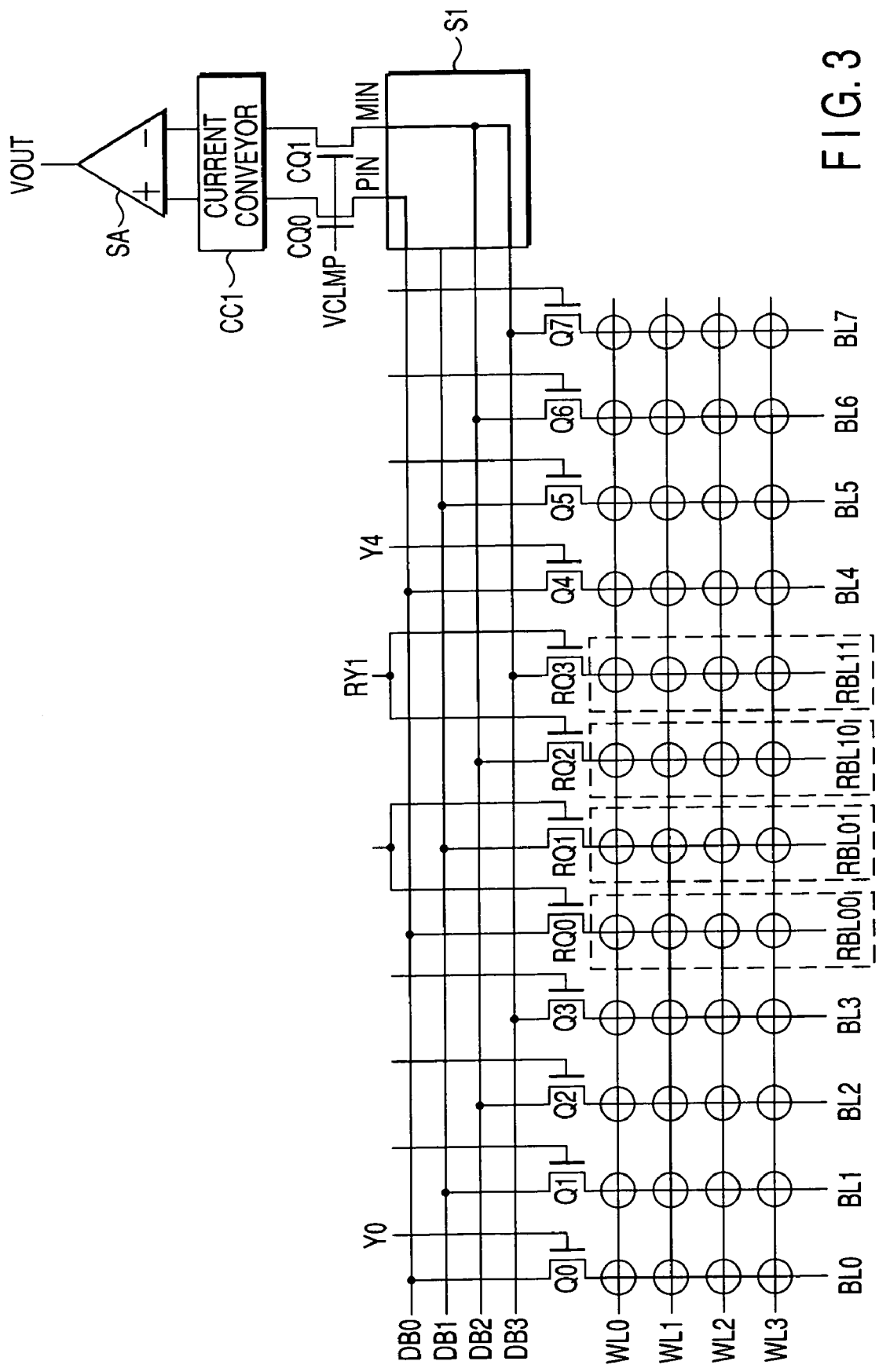
FIG. 3 is a view showing one state of the circuit shown in FIG. 2.

The operation of the circuit shown in FIG. 2 will be explained below with reference to FIG. 3 to FIG. 6. FIG. 3 shows a state that the column select signal Y0 or Y4 is selected, that is, data is read the read data bus DB0. In this case, reference potential is read to the pair of read data buses DB2 and DB3. In other words, any of word lines WL0 to WL3 is selected, and thereafter, the column select signals Y0 or Y4 and RY1 are selected. The read data bus selector S1 connects the read data bus DB0 to the output terminal PIN while connecting read data buses DB2 and DB3 to the output terminal MIN.

Figure 4:
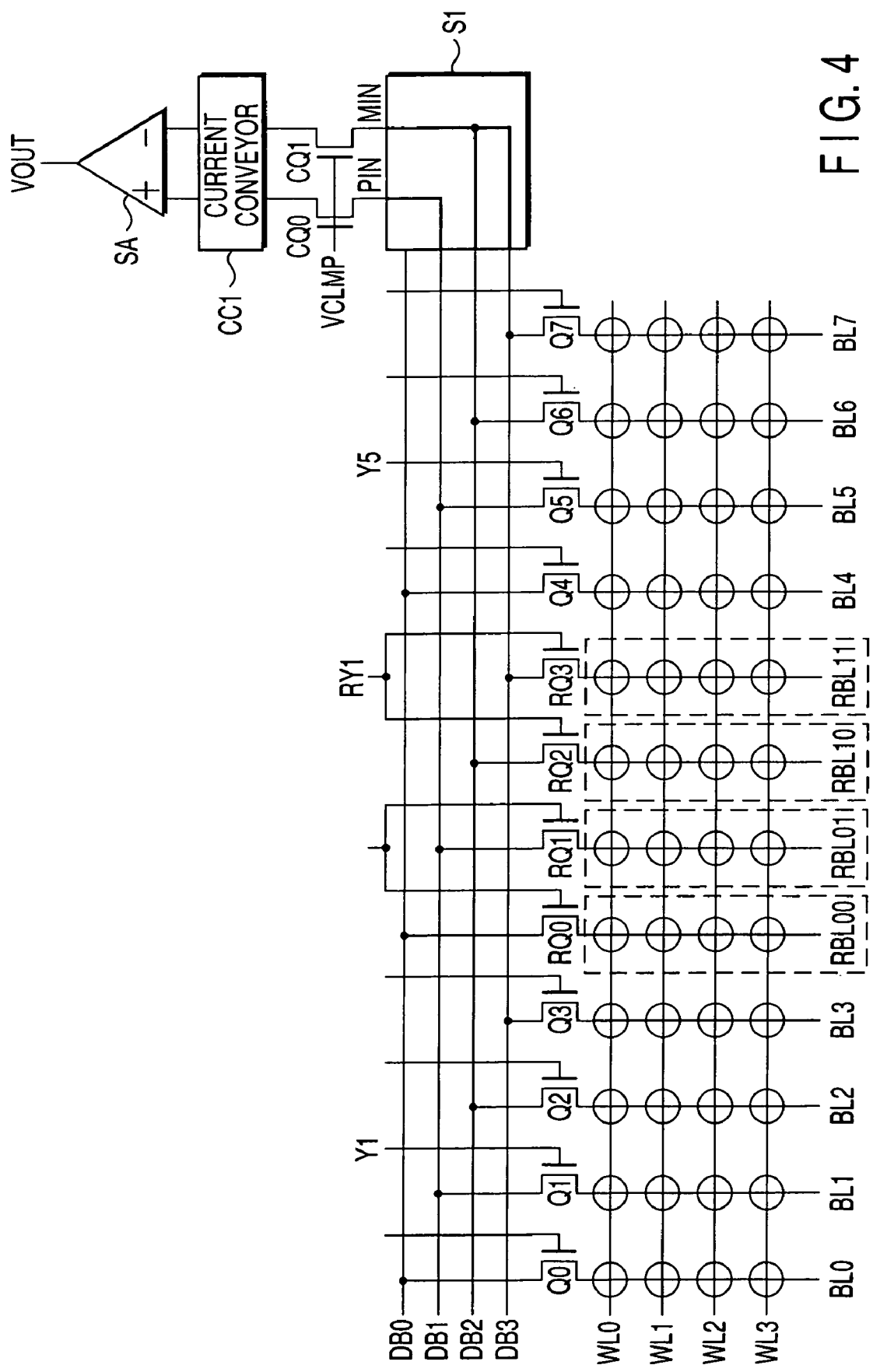
FIG. 4 is a view showing another state of the circuit shown in FIG. 2.

FIG. 4 shows a state that the column select signal Y1 or Y5 is selected, that is, data is read to the read data bus DB1. In this case, reference potential is read to the pair of read data buses DB2 and DB3. In other words, any of word lines WL0 to WL3 is selected, and thereafter, the column select signals Y1 or Y5 and RY1 are selected. The read data bus selector S1 connects the read data bus DB1 to the output terminal PIN while connecting read data buses DB2 and DB3 to the output terminal MIN.

Figure 5:
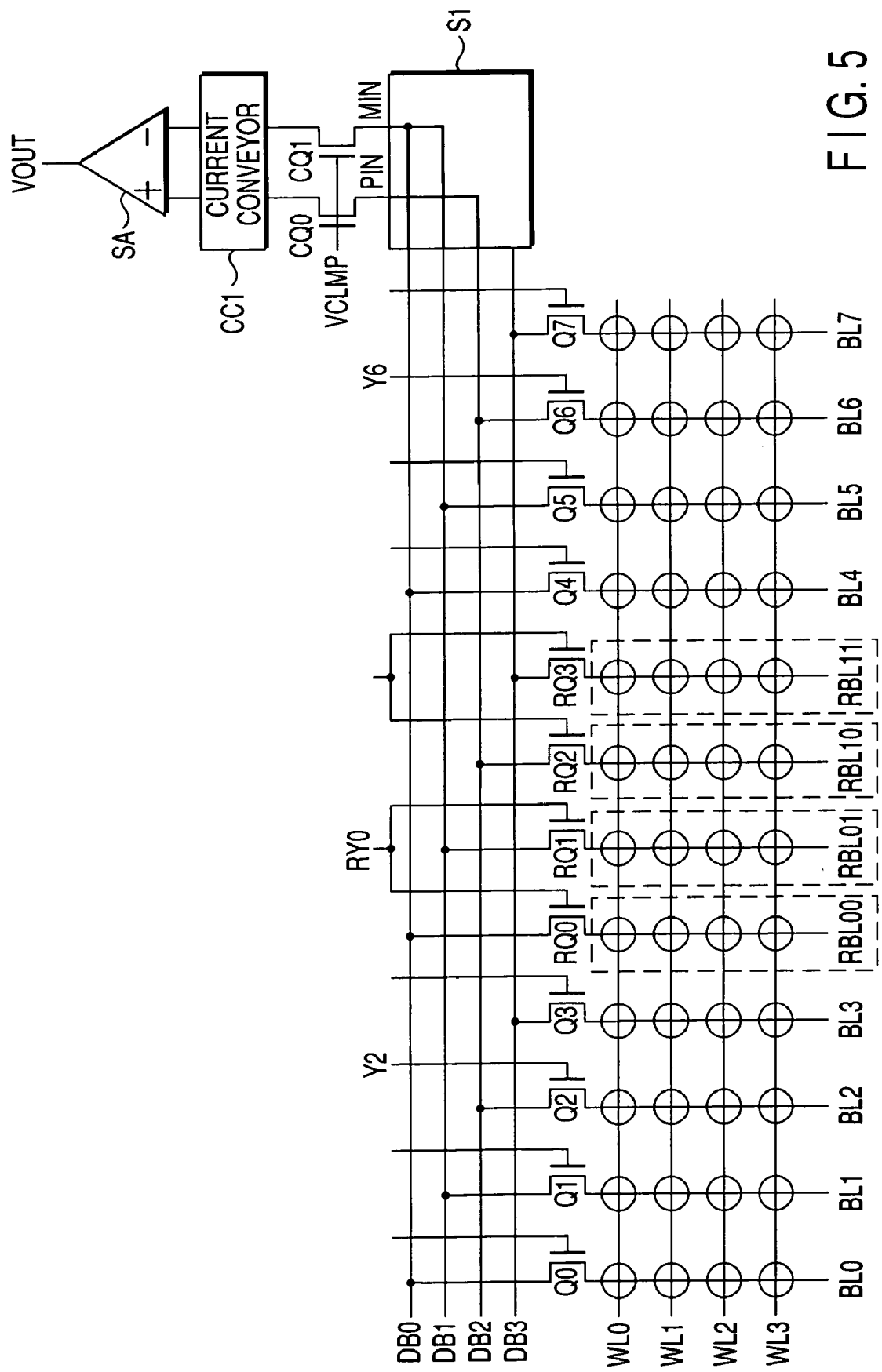
FIG. 5 is a view showing another state of the circuit shown in FIG. 2.

FIG. 5 shows a state that the column select signal Y2 or Y6 is selected, that is, data is read to the read data bus DB2.

In this case, reference potential is read to the pair of read data buses DB0 and DB1. In other words, any of word lines WL0 to WL3 is selected, and thereafter, the column select signals Y2 or Y6 and RY0 are selected. The read data bus selector S1 connects the read data bus DB2 to the output terminal PIN while connecting read data buses DB0 and DB1 to the output terminal MIN.

Figure 6:
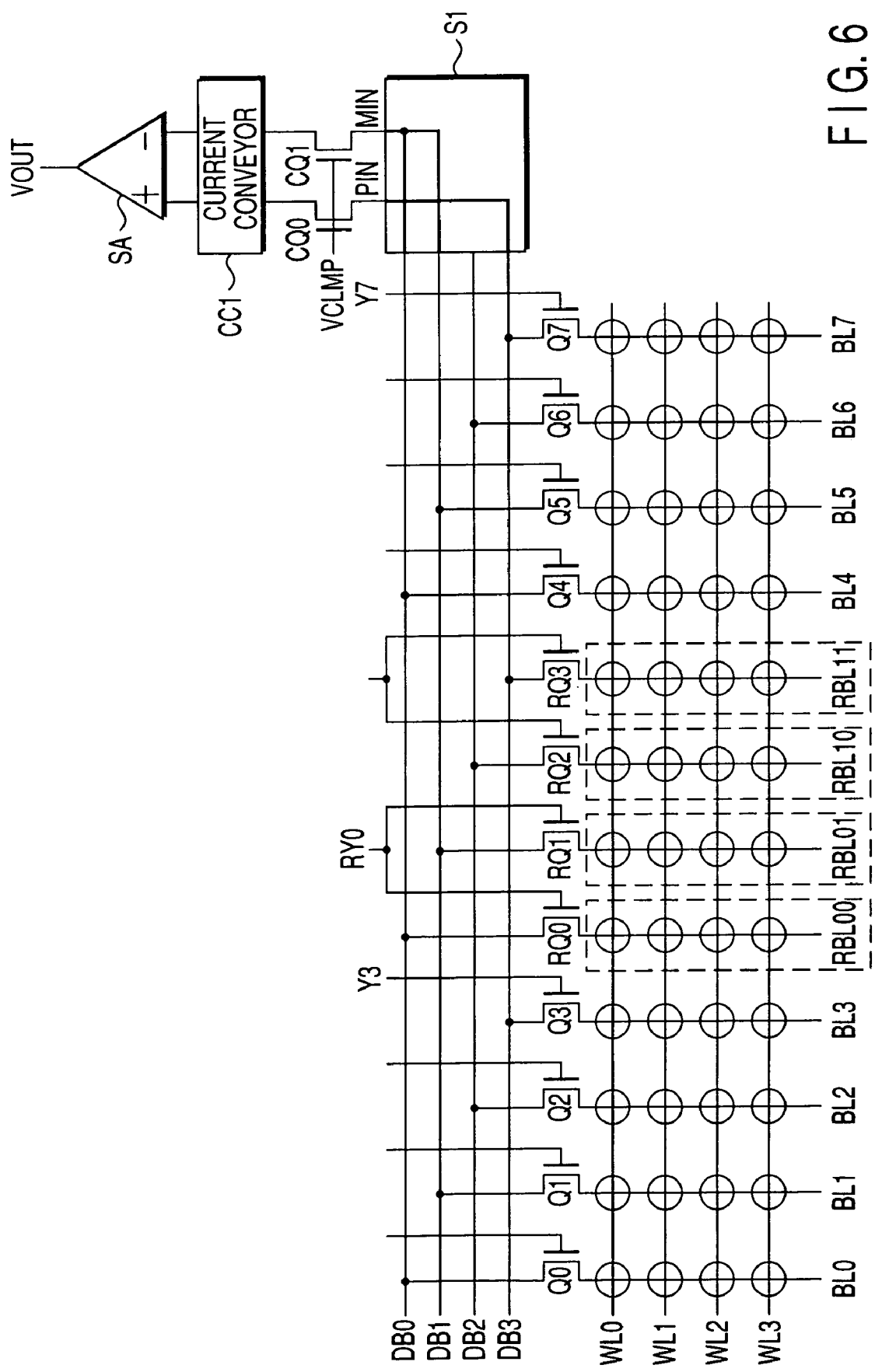
FIG. 6 is a view showing another state of the circuit shown in FIG. 2.

FIG. 6 shows a state that the column select signal Y3 or Y7 is selected, that is, data is read to the read data bus DB3. In this case, reference potential is read to the pair of read data buses DB0 and DB1. In other words, any of word lines WL0 to WL3 is selected, and thereafter, the column select signals Y3 or Y7 and RY0 are selected. The read data bus selector S1 connects the read data bus DB3 to the output terminal PIN while connecting read data buses DB0 and DB1 to the output terminal MIN.

Figure 7:
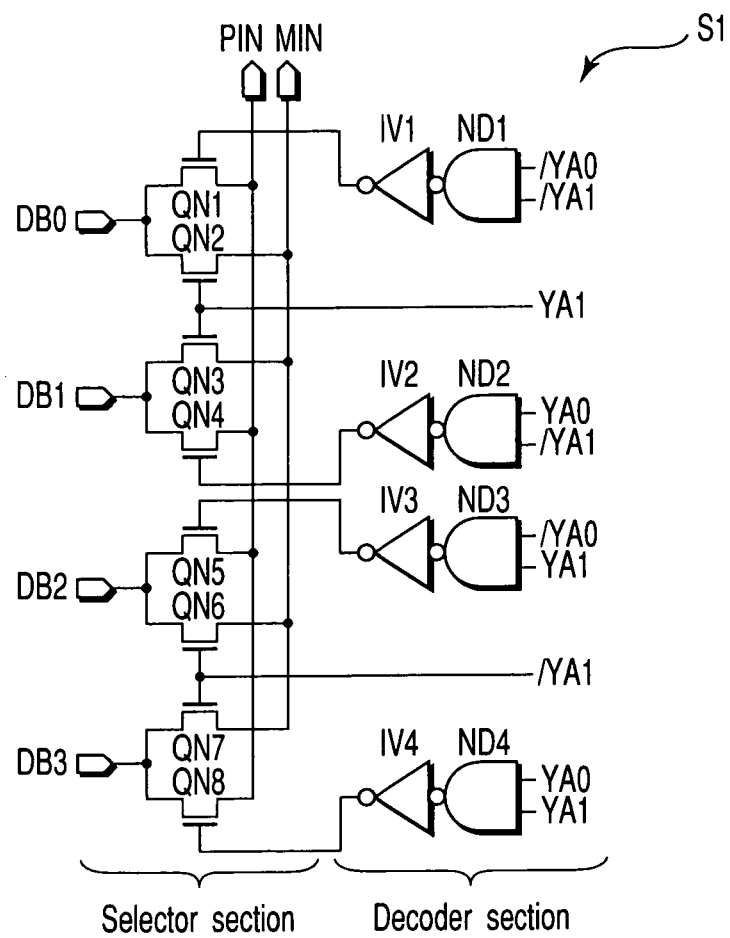
FIG. 7 is a view showing the circuit configuration of a read data bus selector according to the first embodiment.

The read data bus selector S1 will be explained below with reference to FIG. 7. FIG. 7 shows the circuit configuration of the read data bus selector S1. The circuit configuration shown in FIG. 7 is employed, thereby obtaining the read data bus selector S1 capable of realizing the operation described in FIG. 3 to FIG. 6. As depicted in FIG. 7, the read data bus selector S1 has selector and decoder sections. The selector section selectively connects between read data buses DB0 to DB3 with output terminals PIN and MIN in accordance with the control of the decoder section. The decoder section is composed of N type MOS transistors QN1 to QN8.

The read data bus DB0 is connected with each one terminal of N type MOS transistors QN1 and QN2. The other terminal of the transistor QN1 is connected with the output terminal PIN while the other terminal of the transistor QN2 is connected with the output terminal MIN.

The read data bus DB1 is connected with each one terminal of N type MOS transistors QN3 and QN4. The other terminal of the transistor QN3 is connected with the output terminal MIN while the other terminal of the transistor QN4 is connected with the output terminal PIN.

The read data bus DB2 is connected with each one terminal of N type MOS transistors QN5 and QN6. The other terminal of the transistor QN5 is connected with the output terminal PIN while the other terminal of the transistor QN6 is connected with the output terminal MIN.

The read data bus DB3 is connected with each one terminal of N type MOS transistors QN7 and QN8. The other terminal of the transistor QN7 is connected with the output terminal MIN while the other terminal of the transistor QN8 is connected with the output terminal PIN.

The decoder section controls the selector section in accordance with address signal, and is composed of NAND circuits ND1 to ND4 and inverter circuits IV1 to IV4. The NAND circuit ND1 is supplied with a signal /YA0 and /YA1 (symbol "/" represents an inverted signal). The output of the NAND circuit ND1 is supplied to the gate of the transistor QN1 via the inverter circuit IV1. A signal YA0 is the least significant bit of column address; on the other hand, a signal YA1 is a bit one superior to the signal YA0. The signal YA1 is supplied to each gate of transistors QN2 and QN3.

The NAND circuit ND2 is supplied with signals YA0 and /YA1. The output of the NAND circuit ND2 is supplied to the gate of the transistor QN4 via the inverter circuit IV2. The NAND circuit ND3 is supplied with signals /YA0 and YA1. The output of the NAND circuit ND3 is supplied to the gate of the transistor QN5 via the inverter circuit IV3.

The signal /YA1 is supplied to each gate of transistors QN6 and QN7. The NAND circuit ND4 is supplied with signals YA0 and YA1. The output of the NAND circuit ND4 is supplied to the gate of the transistor QN8 via the inverter circuit IV4.

In the circuit shown in FIG. 2, the least significant two bits of the column address for selecting column select signals Y0 and Y4 are set as "00". Likewise, the two bits of the column address for selecting column select signals Y1 and Y5 are set as "10". The two bits of the column address for selecting column select signals Y2 and Y6 are set as "01". The two bits of the column address for selecting column select signals Y3 and Y7 are set as "11". By doing so, when the column select signal Y0 is selected, data information of YA0="0" and YA1="0" is given. Therefore, the transistor QN1 of the data bus selector S1 shown in FIG. 7 turns on, so that the read data bus DB0 and the output terminal PIN is connected. As a result, data is read from the memory cell connected with the bit line BL0 to the output terminal PIN. Transistors QN6 and QN7 both also turn on, and thereby, read data buses DB2 and DB3 are both connected to the output terminal MIN. As a result, data "0" and "1" are read from the reference cells RMC connected with bit lines RBL10 and RBL11, and reference potential formed by combining these data is read to the output terminal MIN. Likewise, when the column select signal Y2 is selected, data information of YA0="0" and YA1="1" is given. Therefore, the read data bus DB2 is connected to the output terminal PIN; on the other hand, read data buses DB0 and DB1 are both connected to the output terminal MIN.

Figure 8:
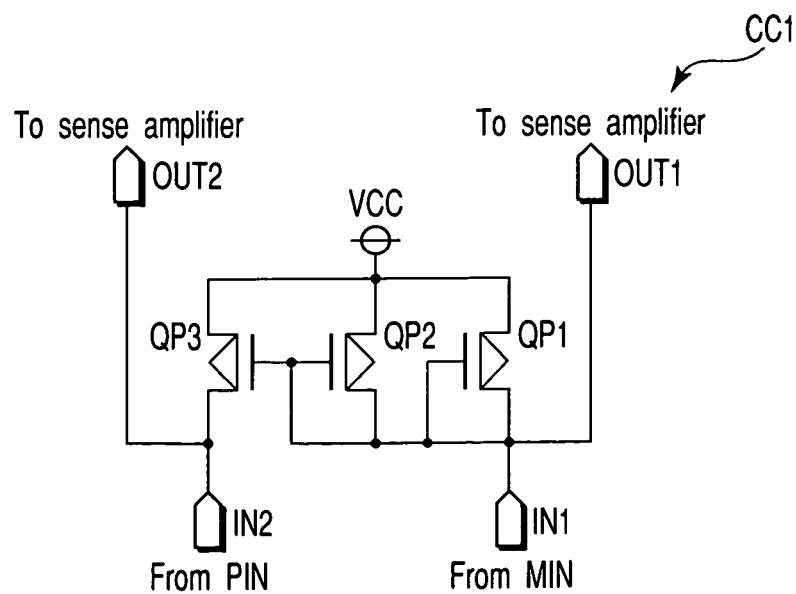
FIG. 8 is a view showing the circuit configuration of a current conveyor according to the first embodiment.

The current conveyor CC1 will be explained below with reference to FIG. 8. FIG. 8 shows the circuit configuration of the current conveyor CC1. As shown in FIG. 8, the current conveyor CC1 is composed of three P type MOS transistors QP1 to QP3. The transistors QP1 to QP3 all have the same gate width. Transistors QP1 and QP2 are connected between a power supply potential line VCC and an input terminal IN1. The input terminal IN1 is supplied with a signal from the output terminal MIN of the read data bus selector S1. Each gate of transistors QP1 and QP2 is connected to input terminal IN1 and output terminal OUT1.

The transistor QP3 is connected between the power supply potential line VCC and an input terminal IN2. The input terminal IN2 is supplied with a signal from the output terminal PIN of the read data bus selector S1. The input terminal IN2 is connected with an output terminal OUT2. The gate of the transistor QP3 is connected with the input terminal IN1. In other words, the output terminal MIN of the data bus selector S1 is connected with the transistors QP1, QP2 an combined gate width of which is two times as much as the transistor QP3 connected with the output terminal PIN. Thus, reference potential equivalent to the signal current average value of the sum of data "0" and "1" is outputted from the output terminal OUT1.

Figure 9:
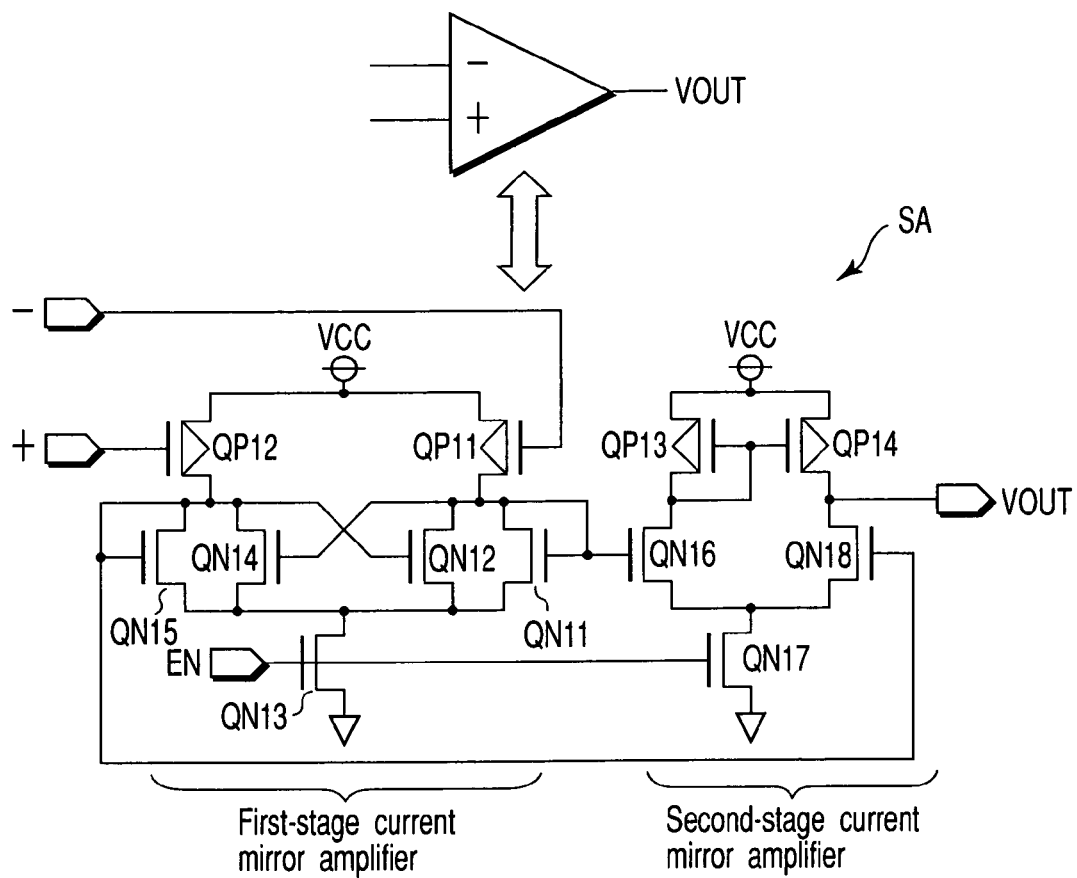
FIG. 9 is a view showing the circuit configuration of a sense amplifier according to the first embodiment.

The sense amplifier SA will be explained below with reference to FIG. 9. FIG. 9 shows an example of a circuit configuration of the sense amplifier SA. As illustrated in FIG. 9, the sense amplifier SA is composed of a first-stage dual differential current mirror amplifier circuit and a second-stage single differential current mirror amplifier circuit. In the first-stage current mirror amplifier circuit, an inverted input terminal is connected to the gate of a P type MOS transistor QP 11 having one terminal supplied with power. The other terminal of the transistor QP 11 is connected to each one terminal of N type MOS transistors QN11 and QN12 and the gate of the transistor QN11. The other terminals of the transistor QN11 and QN12 are mutually connected. The connection node is grounded via an N type MOS transistor QN13. The gate of the transistor QN13 is supplied with an enable signal EN of the sense amplifier SA.

A non-inverting input terminal is connected to the gate of a P type MOS transistor QP 12 having one terminal supplied with power. The other terminal of the transistor QP 12 is connected to each one terminal of N type MOS transistors QN14 and QN15, and connected with each gate of transistors QN15 and QN12. The gate of the transistor QN14 is connected to a connection node between transistors QP11 and QN12. The other terminals of the transistor QN14 and QN15 are mutually connected. The connection node is connected to a connection node between transistors QN12 and QN13.

In the second-stage current mirror amplifier circuit, a P type MOS transistor QP13 has one terminal supplied with power, and the other terminal connected with one terminal of an N type MOS transistor QN16 and connected to the gate of its own. The gate of the transistor QN16 is connected to a connection node between transistors QP11 and QN 11. The other terminal of the transistor QN16 is grounded via an N type MOS transistor QN17. The gate of the transistor QN17 is supplied with the enable signal EN.

A P type MOS transistor QP14 has one terminal supplied with power and the other terminal connected to one terminal of an N type MOS transistor QN18, and the output VOUT is fetched from the transistor QP14. The gate of the transistor QP14 is connected with the gate of the transistor QP13. A transistor QN18 has the gate connected with the gate of the transistor QN15 and the other terminal connected to a connection node between transistors QN16 and QN17.

Figure 10:
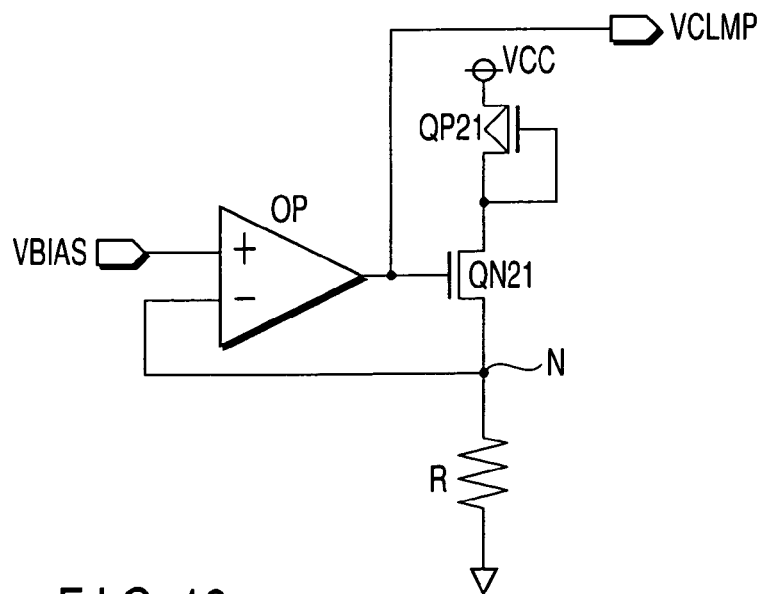
FIG. 10 is a view showing the configuration of a clamping reference potential generator circuit according to the first embodiment.

FIG. 10 shows a clamping reference potential generator circuit. The output potential of the circuit is supplied to each gate of clamping transistors CQ0 and CQ1 shown in FIG. 2. As illustrated in FIG. 10, a reference bias potential VBIAS of 0.3 to 0.5 V is supplied to the non-inverting input terminal of an operational amplifier OP. The output terminal of the operational amplifier OP outputs a clamping reference potential VCLMP. A load P-type MOS transistor QP21 has one terminal supplied with power, and the other terminal connected to the gate of its own and connected with one terminal of a control N-type MOS transistor QN21. The gate of the transistor QN21 is connected with the output terminal of the operational amplifier OP, and the other terminal thereof is grounded via a reference resistor R while being connected to the inverted input terminal.

The circuit shown in FIG. 10 is employed, and thereby, the clamping reference potential VCLMP is set to an intermediate potential that equalizes the potential of a connection node N between the transistor QN21 and the resistor R with the reference bias potential VBIAS. The clamping reference potential VCLMP is supplied to clamping transistors CQ0 and CQ1, and thereby, voltage applied to both terminals of the memory cell MC is clamped to a desired value. As a result, it is possible to prevent variations of current read from the memory cell MC.

According to the first embodiment of the present invention, the semiconductor integrated circuit device has the configuration in which the same number of read gate transistors are connected in each of several read data buses DB0 to DB3. Therefore, the total parasitic capacitance generated resulting from read gate transistors Q0 to Q7 and RQ0 to RQ3 is equal in each of read data buses DB0 to DB3. Individual read gate transistors Q0 to Q7 and RQ0 to RQ3 are connected with the same circuit configuration (e.g., the same number of cells are connected in series) at the opposite side to read data buses DB0 to DB3. Therefore, the RC delay value generated in each of read data buses DB0 to DB3 are equal, and also, time spent for converting signal potential read to read data buses DB0 to DB3 into voltage are equal. Consequently, it is possible to largely reduce read error caused when data and reference data read to different read data buses DB0 to DB3 are used.

According to the first embodiment, memory cell array MCA, read gate transistors Q0 to Q7 and RQ0 to RQ3, read data buses DB0 to DB3, read data bus selector S and amplifier section A form the series-connection path. Thus, the peripheral circuit (peripheral functional section), which includes read gate transistors Q0 to Q7 and RQ0 to RQ3, read data buses DB0 to DB3, read data bus selector S and amplifier section A, is formed on the semiconductor substrate C independently from the memory cell array MCA. This forms no useless space that could appear when part of the peripheral circuit is formed in the memory cell array MCA, so that the area of the memory cell array MCA can be reduced. In particular, several configurations including the memory cell array MCA and the peripheral circuit are provided. In this case, the memory cell array MCA is concentrated at the center of the semiconductor substrate, and the peripheral circuit is provided around the memory cell array. By doing so, it is possible to realize miniaturization of the semiconductor integrated circuit device. In addition, part of the peripheral circuit is not formed in the memory cell array MCA. Therefore, it is possible to prevent the arrangement regularity of each cell from being disturbed, and to readily manufacture the semiconductor integrated circuit device.

Second Embodiment

Figure 11:
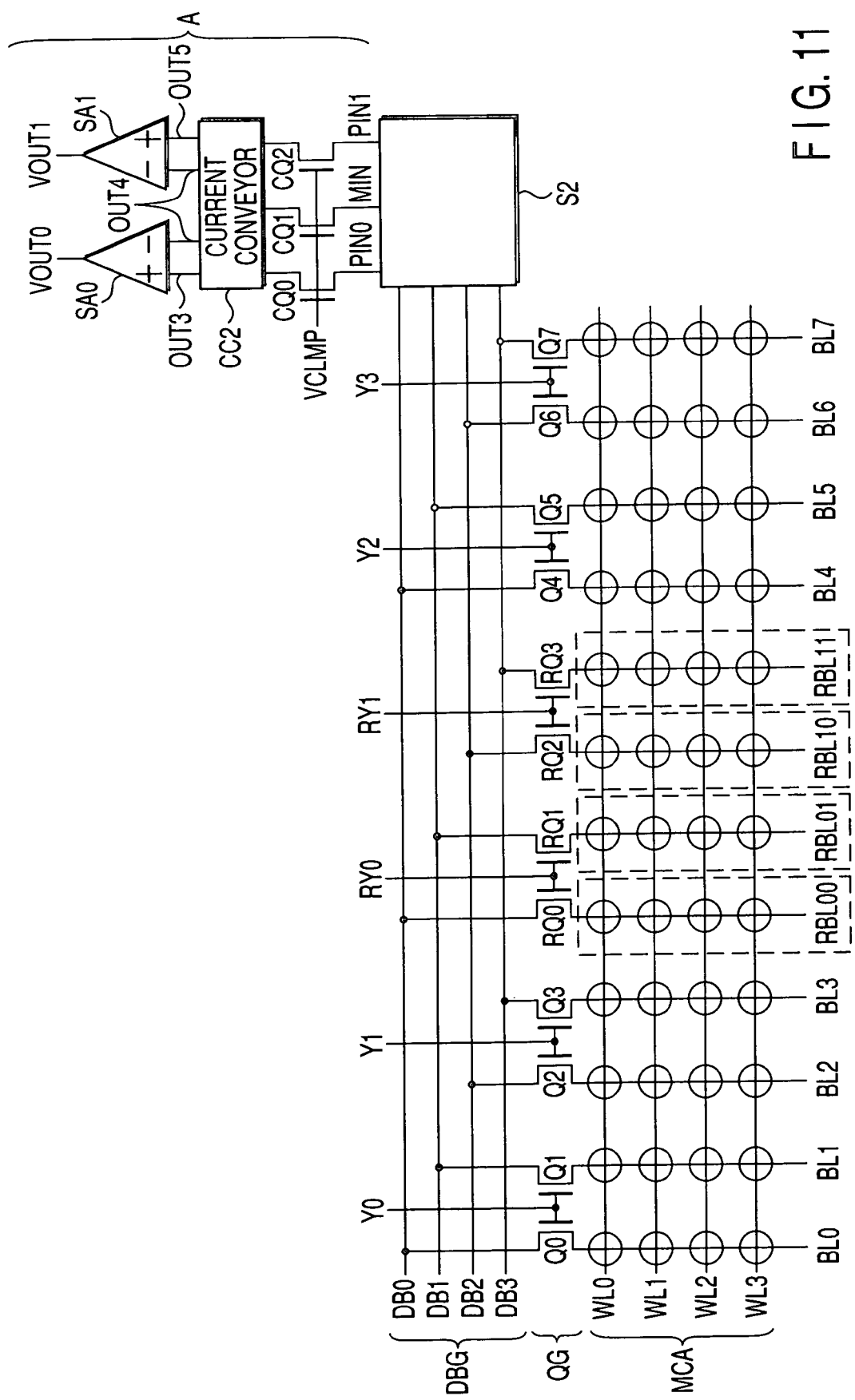
FIG. 11 is a view showing detail of a part of a semiconductor integrated circuit device according to a second embodiment of the present invention.

According to the second embodiment, several data are read in accordance with one address signal. FIG. 11 is a view showing detail of part of a semi-conductor integrated circuit device according to a second embodiment of the present invention. The whole structure is the same as the first embodiment (FIG. 1). FIG. 11 shows the details of memory cell array MCA, read gate transistor group QG, read data bus group BG, read data selector S (S2) and read amplifier section A.

As shown in FIG. 11, read gate transistors Q0 to Q3 have one terminal connected individually with read data buses DB0 to DB3, respectively. Read gate transistors Q4 to Q7 have one terminal connected individually with read data buses DB0 to DB3, respectively.

The gate of read gate transistors Q0 and Q1 is supplied with a column select signal Y0. The gate of read gate transistors Q2 and Q3 is supplied with a column select signal Y1. The gate of read gate transistors Q4 and Q5 is supplied with a column select signal Y2. The gate of read gate transistors Q6 and Q7 is supplied with a column select signal Y3.

The read data bus selector S2 connects any two of read data buses DB0 to DB3 to the output terminal MIN while connecting the remaining two buses to output terminals PIN0 and PIN1, respectively.

The output terminals PIN0, MIN and PIN1 are connected with a current conveyor CC2 via clamping transistors CQ0, CQ1 and CQ2, respectively. Voltage signals OUT3 and OUT5 corresponding to output terminals PIN0 and PIN1 are supplied to each non-inverting input terminal of sense amplifiers SA0 and SA1. The sense amplifiers SA0 and SA1 have the same configuration as the sense amplifier SA described above.

The operation of the circuit shown in FIG. 11 will be explained below with reference to FIG. 12 and FIG. 13. FIG. 12 shows a state that the column select signal Y0 or Y2 is selected, that is, data is read to the read data buses DB0 and DB1. In this case, reference potential is read to the pair of read data buses DB2 and DB3. In other words, any of word lines WL0 to WL3 is selected, and thereafter, the column select signals Y0 or Y2 and RY1 are selected. The read data bus selector S2 connects read data buses DB0 and DB1 to the output terminal PIN0 and PIN1, respectively, while connecting read data buses DB2 and DB3 to the output terminal MIN.

Figure 13:
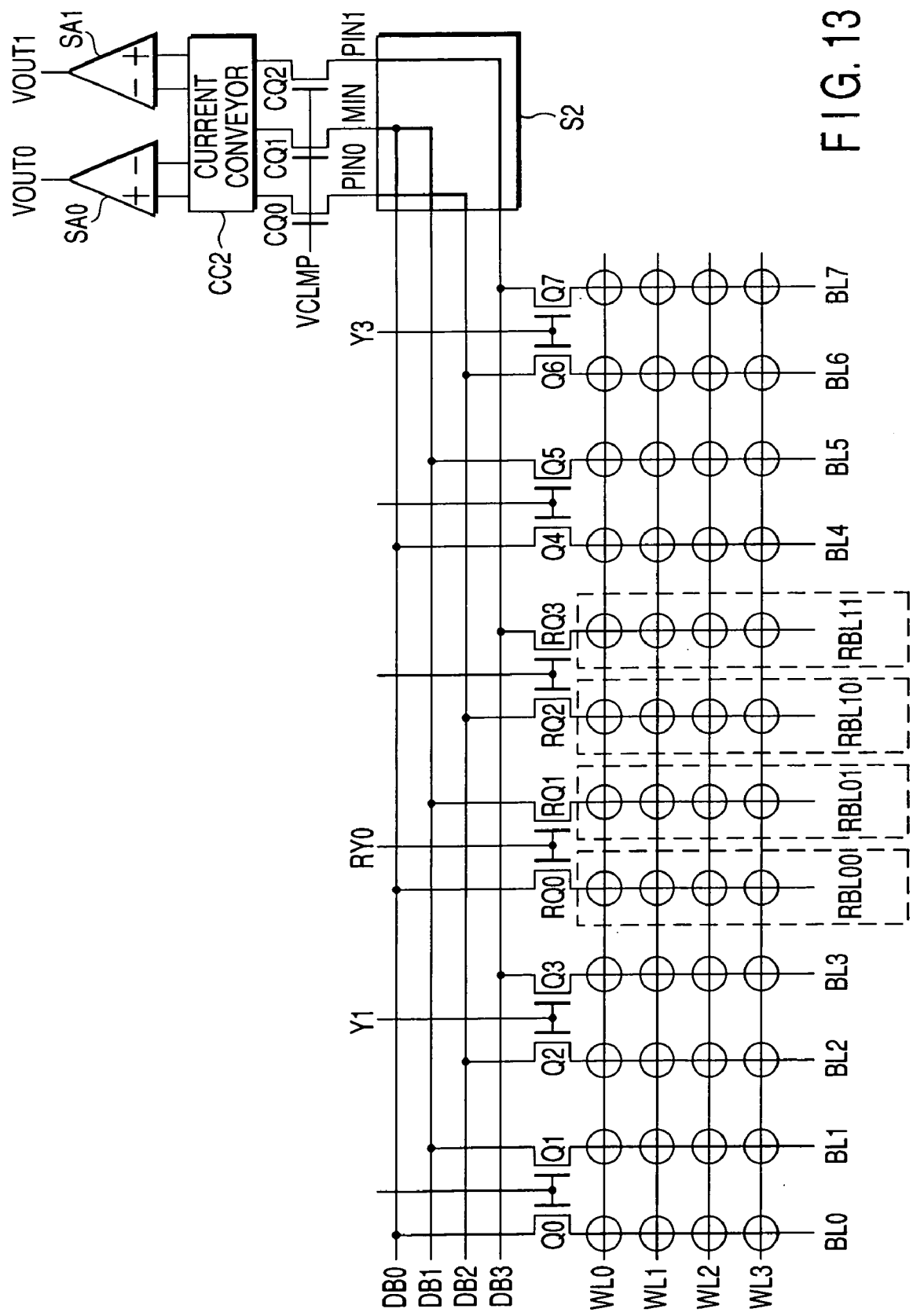
FIG. 13 is a view showing another state of the circuit shown in FIG. 11.

FIG. 13 shows a state that the column select signal Y1 or Y3 is selected, that is, data is read to the read data buses DB2 and DB3. In this case, reference potential is read to the read data buses DB0 and DB1. In other words, any of word lines WL0 to WL3 is selected, and thereafter, the column select signals Y1 or Y3 and RY0 are selected. The read data bus selector S2 connects read data buses DB2 and DB3 to the output terminals PIN0 and PIN1, respectively, while connecting read data buses DB0 and DB1 to the output terminal MIN.

Figure 14:
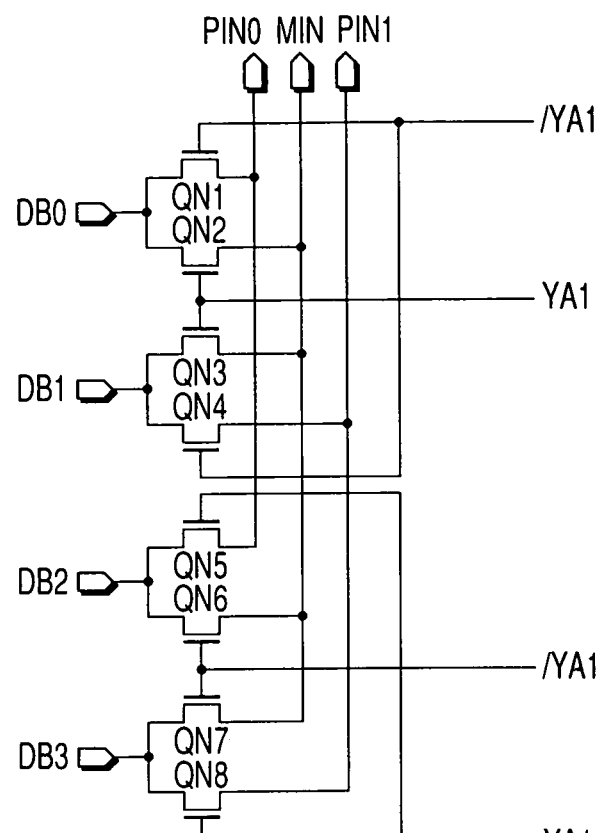
FIG. 14 is a view showing the circuit configuration of a read data bus selector according to the second embodiment.

The read data bus selector S2 will be explained below with reference to FIG. 14. FIG. 14 shows the circuit configuration of the read data bus selector S2. The circuit configuration shown in FIG. 14 is employed, thereby obtaining the read data bus selector S2 capable of realizing the operation described in FIG. 12 and FIG. 13. As depicted in FIG. 14, each one terminal of transistors QN1 and QN5 is connected with the output terminal PIN0. Each one terminal of transistors QN2, QN3, QN6 and QN7 is connected with the output terminal MIN. Each one terminal of transistors QN4 and QN8 is connected with the output terminal PIN1.

Each gate of transistors QN1, QN4, QN6 and QN7 is supplied with a signal /YA1. Each gate of transistors QN2, QN3, QN5 and QN8 is supplied with a signal YA1.

When the column select signal Y0 or Y2 is selected, the signal /YA1 becomes the high level; as a result, the read data bus selector S2 takes the same state as FIG. 12. When the column select signal Y1 or Y3 is selected, the signal YA1 becomes the high level; as a result, the read data bus selector S2 takes the same state as FIG. 13.

Figure 15:
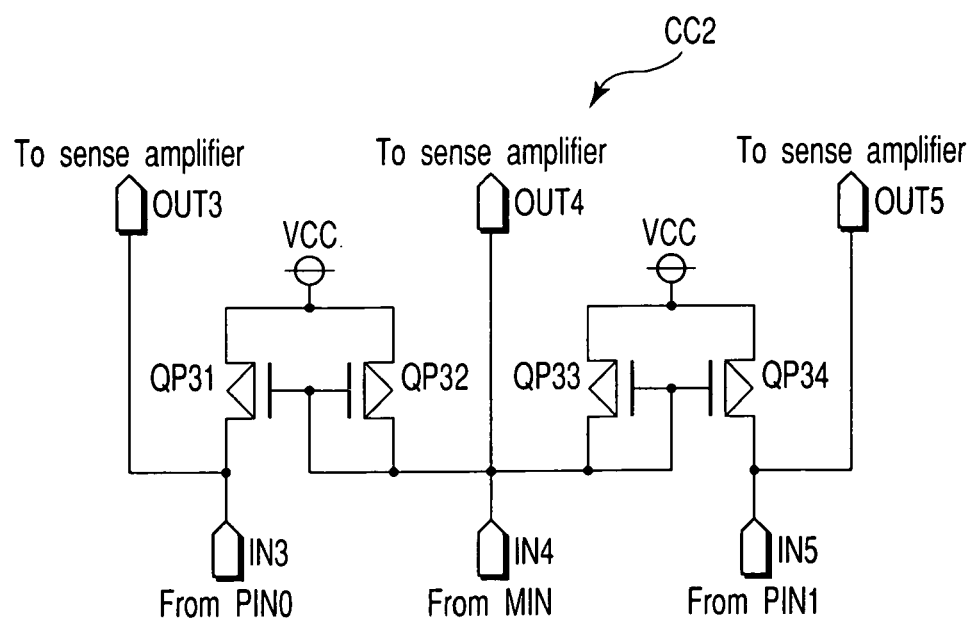
FIG. 15 is a view showing the circuit configuration of a current conveyor according to the second embodiment.

The current conveyor CC2 will be explained below with reference to FIG. 15. FIG. 15 shows the circuit configuration of the current conveyor CC2. As illustrated in FIG. 15, the current conveyor CC2 is composed of current-mirror-connected P type MOS transistors QP31 to QP34. The transistors QP31 to QP34 all have the same gate width. Each one terminal of transistors QP31 and QP32 is connected with a power supply potential line VCC. The other terminal of the transistor QP31 is connected with input terminal IN3 and output terminal OUT3. The input terminal IN3 is supplied with a signal from the output terminal PIN0. The other terminal of the transistor QP32 is connected with the gate of its own and the transistor QP31 while being connected with input terminal IN4 and output terminal OUT4. The input terminal IN4 is supplied with a signal from the output terminal MIN.

Each one terminal of transistors QP33 and QP34 is connected with a power supply line VCC. The other terminal of the transistor QP33 is connected with the gate of its own and the transistor QP34 while being connected with input terminal IN4 and output terminal OUT4. The other terminal of the transistor QP34 is connected with input terminal IN5 and output terminal OUT5. The input terminal IN5 is supplied with a signal from the output terminal PIN1.

According to the second embodiment of the present invention, the same effect as the first embodiment is obtained in the semiconductor integrated circuit device. In addition, the second embodiment is applicable to the configuration of reading two-bit data in accordance with one address.

Third Embodiment

Figure 16:
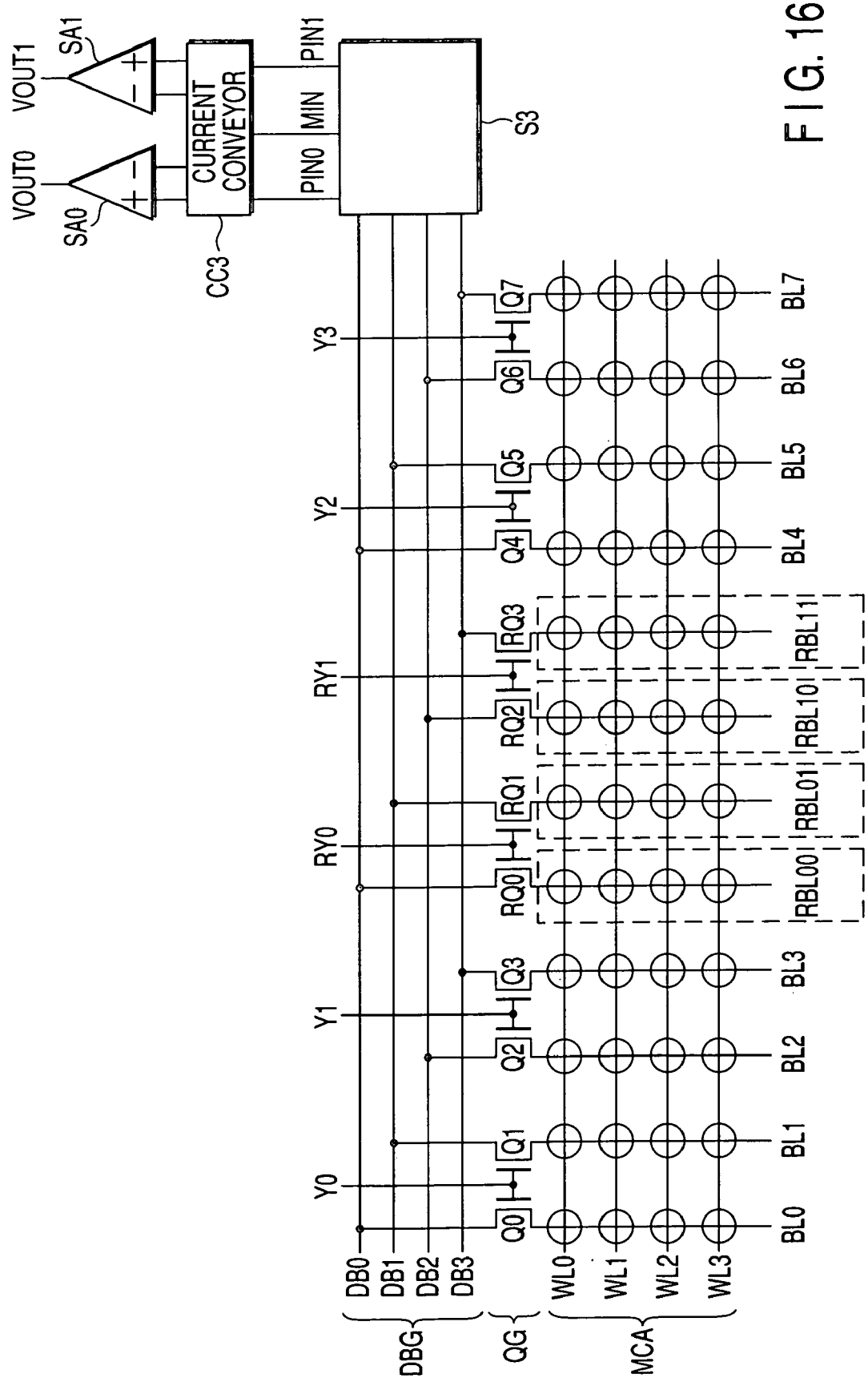
FIG. 16 is a view showing detail of a part of a semiconductor integrated circuit device according to a third embodiment of the present invention.

The third embodiment is a modification example of the second embodiment; more specifically, a read data bus selector S3 includes the function of clamping transistors CQ0 to CQ2. FIG. 16 is a view showing detail of a part of a semiconductor integrated circuit device according to a third embodiment of the present invention. The whole structure is the same as the first embodiment (FIG. 1). FIG. 16 shows the details of memory cell array MCA shown in FIG. 1, read gate transistor group QG, read data bus group BG, read data selector S (S3) and read amplifier section A. The operation is the same as the second embodiment.

Figure 17:
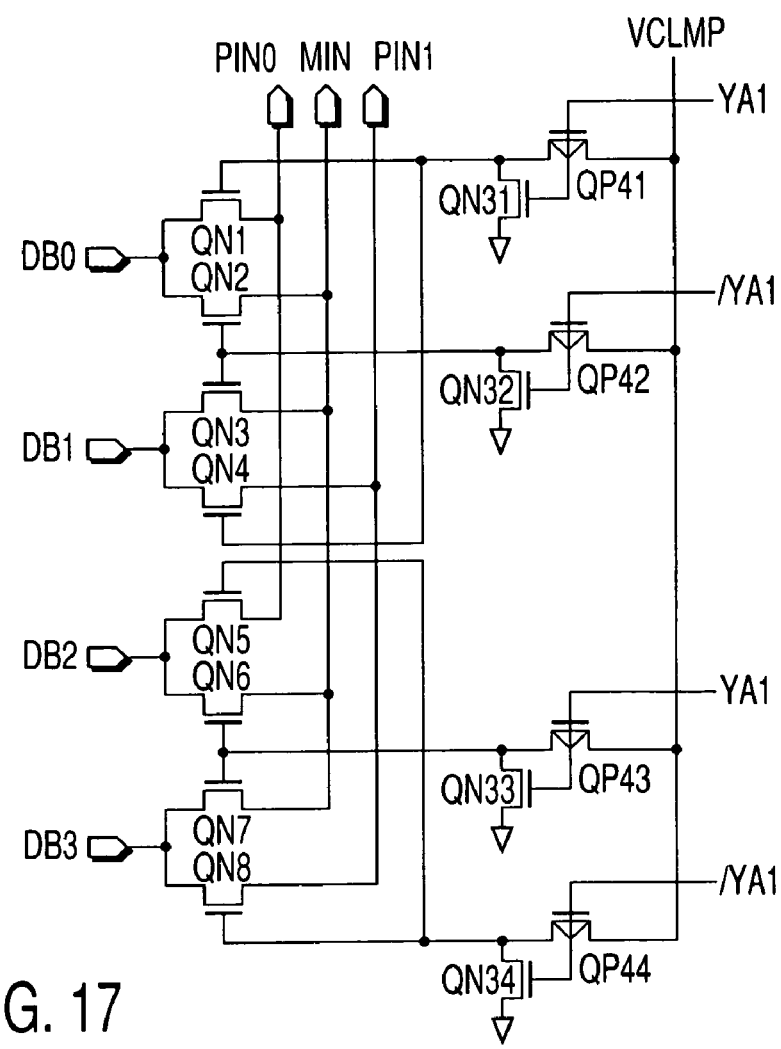
FIG. 17 is a view showing the circuit configuration of a read data bus selector according to the third embodiment.

FIG. 17 shows an example of the circuit configuration of the read data selector S3. As seen from FIG. 17, each gate of transistors QN1 and QN4 is connected to one terminal of N type MOS transistor QN31 and P type transistor QP41. The other terminal of the transistor QN31 is grounded. The other terminal of the transistor QP41 is supplied with a clamping reference potential VCLMP. Each gate of transistors QN31 and QP41 is supplied with a signal YA1.

Each gate of transistors QN2 and QN3 is connected to one terminal of N type MOS transistor QN32 and P type transistor QP42. The other terminal of the transistor QN32 is grounded. The other terminal of the transistor QP42 is supplied with the clamping reference potential VCLMP. Each gate of transistors QN32 and QP42 is supplied with a signal /YA1.

Each gate of transistors QN6 and QN7 is connected to one terminal of N type MOS transistor QN33 and P type transistor QP43. The other terminal of the transistor QN33 is grounded. The other terminal of the transistor QP43 is supplied with the clamping reference potential VCLMP. Each gate of transistors QN33 and QP43 is supplied with a signal YA1.

Each gate of transistors QN5 and QN8 is connected to one terminal of N type MOS transistor QN34 and P type transistor QP44. The other terminal of the transistor QN34 is grounded. The other terminal of the transistor QP44 is supplied with the clamping reference potential VCLMP. Each gate of transistors QN34 and QP44 is supplied with a signal /YA1.

The read data bus selector S3 of FIG. 17 can realize the same operation as carried out by the read data bus selector S2 and clamping transistors CQ0 to CQ2 described in the second embodiment.

According to the third embodiment of the present invention, the same effect as the second embodiment is obtained in the semiconductor integrated circuit device.

The first to third embodiments have been explained for the case where the number of read data buses is four. The present invention is not limited to the foregoing embodiments, and the number of bit lines and read data buses may be properly set in accordance with memory capacity.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a semiconductor substrate comprising a first region extending along an edge and a second region surrounded by the first region;
   a plurality of memory cell arrays provided in the second region, and comprising a plurality of cells having an MTJ element;
   a plurality of gate transistors provided in the first region, and having a current path having a first terminal connected with a bit line, which is a signal read path from the cells, and a second terminal opposite to the first terminal;
   a plurality of data buses connected with a same number of the second terminals;
   a connection control circuit provided in the first region, and connected with an end of the data buses, and connecting selected two of the data buses to first and second output terminals, respectively; and
   an amplifier circuit provided in the first region, and amplifying a potential difference in accordance with signals outputted from the first and second output terminals.

2. The device according to claim 1, wherein the memory cell array has no transistor other than a select transistor that the cells have.

3. The device according to claim 1, wherein the cells include:
a plurality of memory cells storing data; and
a plurality of reference cells storing reference data used for determining the data.

4. The device according to claim 3, wherein the gate transistors include:
a plurality of data gate transistors connected with bit lines, which are signal read paths from the memory cells; and
a plurality of reference data gate transistors connected with reference bit lines, which are signal read paths from the reference cells.

5. The device according to claim 4, wherein the reference data gate transistors are-connected to the data buses.

6. The device according to claim 5, wherein the reference cells include a first reference cell storing data "0" and a second reference cell storing data "1" and
the connection control circuit connects one of the data buses selectively connected with the first reference cell and one of the data buses selectively connected with the second reference cell to the first output terminal, and connects one of the data buses selectively connected with a first memory cell of the memory cells to the second output terminal.

7. The device according to claim 6, wherein the amplifier circuit includes a clamping circuit section, which clamps signals supplied from the first and second output terminals to a predetermined potential in accordance with the signals.

8. The device according to claim 6, wherein
the connection control circuit further includes a third output terminal, and connects one of the data buses selectively connected with the second memory cell selected by the same address as the first memory cell to the third output terminal, and
the amplifier circuit has a first section amplifying a potential difference in accordance with signals outputted from the first and second output terminals, and a second section amplifying a potential difference in accordance with signals outputted from the first and third output terminals.

9. The device according to claim 8, wherein the amplifier circuit further includes a clamping circuit section, which is provided in the first region and clamps signals supplied from the first to third output terminals to a predetermined potential in accordance with the signals.

10. The device according to claim 8, wherein the connection control circuit includes a clamping circuit section, which clamps signals supplied from the data buses to a predetermined potential in accordance with the signals.

11. A semiconductor integrated circuit device comprising:
a semiconductor substrate;
a plurality of memory cell arrays provided in a center of the semiconductor substrate, and comprising a plurality of cells having an MTJ element; and
a plurality of peripheral functional sections provided only around the memory cell arrays on the semiconductor substrate, at least one of the peripheral functional sections including:
a plurality of gate transistors having a current path having a first terminal connected with one bit line, which is a signal read path from the cells, and a second terminal opposite to the first terminal;
a plurality of data buses connected with a same number of the second terminals;
a connection control circuit connected with an end of the data buses, and connecting selected two of the data buses to first and second output terminals, respectively; and
an amplifier circuit amplifying a potential difference in accordance with signals outputted from the first and second output terminals.

12. The device according to claim 11, wherein the memory cell array has no transistor other than a select transistor that the cells have.

13. The device according to claim 11, wherein the cells include:
a plurality of memory cells storing data; and
a plurality of reference cells storing reference data used for determining the data.

14. The device according to claim 13, wherein the gate transistors include:
a plurality of data gate transistors connected with bit lines, which are signal read paths from the memory cells; and
a plurality of reference data gate transistors connected with reference bit lines, which are signal read paths from the reference cells.

15. The device according to claim 14, wherein the reference data gate transistors are connected to the data buses.

16. The device according to claim 15, wherein
the reference cells include a first reference cell storing data "0" and a second reference cell storing data "1" and
the connection control circuit connects one of the data buses selectively connected with the first reference cell and one of the data buses selectively connected with the second reference cell to the first output terminal, and connects one of the data buses selectively connected with a first memory cell of the memory cells to the second output terminal.

17. The device according to claim 16, wherein the amplifier circuit includes a clamping circuit section, which clamps signals supplied from the first and second output terminals to a predetermined potential in accordance with the signals.

18. The device according to claim 16, wherein
the connection control circuit further includes a third output terminal, and connects one of the data buses selectively connected with the second memory cell selected by the same address as the first memory cell to the third output terminal, and
the amplifier circuit has a first section amplifying a potential difference in accordance with signals outputted from the first and second output terminals, and a second section amplifying a potential difference in accordance with signals outputted from the first and third output terminals.

19. The device according to claim 18, wherein the amplifier circuit further includes a clamping circuit section, which is provided in the first region and clamps signals supplied from the first to third output terminals to a predetermined potential in accordance with the signals.

20. The device according to claim 18, wherein the connection control circuit includes a clamping circuit section, which clamps signals supplied from the data buses to a predetermined potential in accordance with the signals.

* * * * *